(12) United States Patent
Lin et al.

(10) Patent No.: US 9,601,202 B2
(45) Date of Patent: Mar. 21, 2017

(54) LOW VOLTAGE DIFFERENCE OPERATED EEPROM AND OPERATING METHOD THEREOF

(71) Applicant: YIELD MICROELECTRONICS CORP., Hsinchu County (TW)

(72) Inventors: Hsin-Chang Lin, Hsinchu County (TW); Wen-Chien Huang, Hsinchu County (TW); Ya-Ting Fan, Hsinchu County (TW); Chia-Hao Tai, Hsinchu County (TW); Tung-Yu Yeh, Hsinchu County (TW)

(73) Assignee: Yield Microelectronics Corp., Hsinchu County (TW)

( * ) Notice: Subject to any disclaimer, the term of this patent is extended or adjusted under 35 U.S.C. 154(b) by 0 days.

(21) Appl. No.: 15/259,281

(22) Filed: Sep. 8, 2016

(65) Prior Publication Data

US 2016/0379712 A1 Dec. 29, 2016

Related U.S. Application Data

(62) Division of application No. 14/707,410, filed on May 8, 2015.

(51) Int. Cl.
*G11C 16/04* (2006.01)
*G11C 16/16* (2006.01)
*G11C 16/10* (2006.01)
*H01L 27/115* (2006.01)

(52) U.S. Cl.
CPC .......... *G11C 16/0433* (2013.01); *G11C 16/10* (2013.01); *G11C 16/16* (2013.01); *H01L 27/11521* (2013.01); *G11C 16/0416* (2013.01)

(58) Field of Classification Search
CPC ............. H01L 27/115; H01L 27/11521; G11C 16/0416
USPC .................... 365/185.01, 185.1, 185.26, 149
See application file for complete search history.

(56) References Cited

U.S. PATENT DOCUMENTS

| | | | |
|---|---|---|---|
| 6,841,447 B1 * | 1/2005 | Logie | H01L 27/115 257/E21.694 |
| 2005/0270850 A1 * | 12/2005 | Wang | G11C 16/0416 365/185.28 |

* cited by examiner

*Primary Examiner* — Jason Lappas
(74) *Attorney, Agent, or Firm* — Rosenberg, Klein & Lee

(57) ABSTRACT

The present invention discloses a low voltage difference-operated EEPROM and an operating method thereof, wherein at least one transistor structure is formed in a semiconductor substrate and each includes a first electric-conduction gate. Same type ions are implanted into a region of the semiconductor substrate, which is near interfaces of a source, a drain and the first electric-conduction gate, or ion-doped regions of the source and the drain, to increase the ion concentration thereof, whereby to reduce the voltage differences required for writing and erasing. The present invention also discloses an operating method for the low voltage difference-operated EEPROM, in addition to the EEPROM with a single gate transistor structure, the present invention also applies to the EEPROM with a single floating gate transistor structure.

4 Claims, 5 Drawing Sheets

LOW VOLTAGE DIFFERENCE OPERATED EEPROM AND OPERATING METHOD THEREOF

RELATED APPLICATIONS

This application is a Divisional patent application of co-pending application Ser. No. 14/707,410, filed on 8 May 2015, now pending. The entire disclosure of the prior application, Ser. No. 14/707,410 is considered a part of the disclosure of the accompanying Divisional application and is hereby incorporated by reference.

BACKGROUND OF THE INVENTION

Field of the Invention

The present invention relates to an EEPROM technology, particularly to an EEPROM where the concentration of the implanted ion is increased to lower the required voltage difference and an operating method thereof.

Description of the Related

Non-volatile memories, such as Flash memories and EEPROM (Electrically Erasable Programmable Read Only Memory), are semiconductor storage devices that can be electrically written and erased repeatedly. Nowadays, non-volatile memories have been widely used in electronic products because their data will not volatilize after the power source is turned off.

A non-volatile memory is programmable via storing charges to vary the gate voltage of the transistors or via not storing charges to keep the original gate voltage. A non-volatile memory is erasable by removing the charges stored thereinside to restore the original gate voltage thereof. The current EEPROM is erased with a higher voltage difference, which causes the memory to have a larger area and a more complicated fabrication process.

Accordingly, the present invention proposes a low voltage difference and low current operated EEPROM and an operating method thereof to overcome the conventional problems.

SUMMARY OF THE INVENTION

The primary objective of the present invention is to provide a low voltage difference operated EEPROM and an operating method thereof, wherein ions are implanted at a higher concentration to increase the intensity of the electric field between the gate and the substrate or between the gate and the transistor and thus decrease the required voltage difference for erasing or writing EEPROM, and wherein the operating method is able to massively erase or write memory cells simultaneously.

Another objective of the present invention is to provide a low voltage difference operated EEPROM and an operating method thereof, which use the voltage difference between the gate and the source/drain or the voltage difference between the gate and the substrate/well to write or erase EEPROM in a lower current.

To achieve the abovementioned objectives, the present invention proposes a low voltage difference operated EEPROM, which comprises a semiconductor substrate, and at least one transistor structure formed in the semiconductor substrate, wherein the transistor structure includes a first dielectric layer formed on the surface of the semiconductor substrate; a first electric-conduction gate formed on the first dielectric layer; and at least two first ion-doped regions formed inside the semiconductor substrate and respectively at two sides of the first electric-conduction gate to separately function as the source and the drain, and wherein the same type of ions are further implanted into the semiconductor substrate (or the first ion-doped region) at the region where the first electric-conduction gate contacts the source and the semiconductor substrate (or the first ion-doped region) at the region where the electric-conduction gate contacts the drain, whereby to decrease the voltage difference required for writing or erasing the EEPROM.

In addition to the abovementioned single-gate transistor structure, the present invention also applies to a floating-gate transistor structure and further comprises a capacitor structure, which is arranged in the surface of the semiconductor substrate and separated from the transistor structure, wherein the capacitor structure includes a second ion-doped region formed inside the semiconductor substrate; a second dielectric layer formed on the surface of the second ion-doped region; and a second electric-conduction gate stacked on the second dielectric layer and electrically connected with the first electric-conduction gate to function as a floating gate.

No matter whether the single-gate transistor structure or the floating-gate transistor structure is used, further implantation of the same type of ions can increase the ion concentration of the semiconductor substrate or the first ion-doped region by 1-10 times.

While the transistor structure of the present invention is an N-type transistor, the first ion-doped region or the second ion-doped region is an N-type doped region, and the semiconductor substrate is a P-type semiconductor substrate or a semiconductor substrate having a P-type well. While the transistor structure of the present invention is a P-type transistor, the first ion-doped region or the second ion-doped region is a P-type doped region, and the semiconductor substrate is an N-type semiconductor substrate or a semiconductor substrate having an N-type well.

No matter whether the single-gate transistor structure or the floating-gate transistor structure is used, different regions of enhanced ion implantation and different transistor structures are respectively corresponding to different operating methods.

While the transistor structure is an N-type transistor and the first ion-doped region is doped with the same type of ions to increase the ion concentration, the operating method of the present invention comprises a step: respectively applying a gate voltage $V_g$, a source voltage $V_s$, a drain voltage $V_d$ and a substrate voltage $V_{sub}$ to the first electric-conduction gate (or the floating gate), the source, the drain and the semiconductor substrate, wherein in writing, $V_{sub}$=ground, $V_s=V_d\geq 0$, and $V_g$=HV (High Voltage), or $V_{sub}$=ground, $V_s=V_d$=HV, and $V_g>2V$, and wherein in erasing, $V_{sub}$=ground, $V_s=V_d$=HV, and $V_g$=0 floating voltage, or <2V.

While the transistor structure is a P-type transistor and the first ion-doped region is doped with the same type of ions to increase the ion concentration, the operating method of the present invention comprises a step: respectively applying a gate voltage $V_g$, a source voltage $V_s$, a drain voltage $V_d$ and a substrate voltage $V_{sub}$ to the first electric-conduction gate (or the floating gate), the source, the drain and the semiconductor substrate, wherein in writing $V_{sub}$=HV, $V_s=V_d\leq$HV, and $V_g$=0, or $V_{sub}$=HV, $V_s=V_d$=0, and $V_g$ is smaller than HV−2V, and wherein in erasing, $V_{sub}$=HV, $V_s=V_d$=0, and $V_g$ is floating voltage or smaller than HV−2V.

No matter whether a P-type transistor or an N-type transistor is used, while the same type of ions are implanted into the semiconductor substrate to increase the ion concentration, the operating method of the present invention comprises a step: respectively applying a gate voltage $V_g$, a source voltage $V_s$, a drain voltage $V_d$ and a substrate voltage $V_{sub}$ to the first electric-conduction gate (or the floating gate), the source, the drain and the semiconductor substrate, wherein for an N-type transistor in writing, $V_{sub}$=ground, $V_s=V_d\geq 0$, and $V_g$=HV, or $V_{sub}$=ground, $V_s=V_d$=HV, and $V_g$>2V and wherein for an N-type transistor in erasing, $V_{sub}$=ground, $V_s=V_d$=HV, and $V_g$=0, floating voltage, or <2V, and wherein for a P-type transistor in writing, $V_{sub}$=HV, $V_s=V_d\leq$HV, and $V_g$=0, or $V_{sub}$=HV, $V_s=V_d$=0, and $V_g$ is smaller than HV−2V and wherein for a P-type transistor in erasing, $V_{sub}$=HV, $V_s=V_d$=0, and $V_g$ is floating voltage or smaller than HV−2V.

Below, embodiments are described in detail in cooperation with the attached drawings to make easily understood the Objectives, technical contents, and accomplishments of the present invention.

DETAILED DESCRIPTION OF THE INVENTION

The present invention proposes a low voltage difference operated EEPROM (Electrically Erasable Programmable Read Only Memory) and an operating method thereof. The EEPROM of the present invention is characterized in implanting a higher concentration of ions to increase the intensity of the electric field between the gate and the transistor or between the gate and the substrate so as to decrease the voltage difference for writing or erasing. The operating method of the present invention simultaneously applies operating voltages to the gate, the source and the drain, which are connected with a memory cell, to massively write or erase memory cells.

Figure 1A:
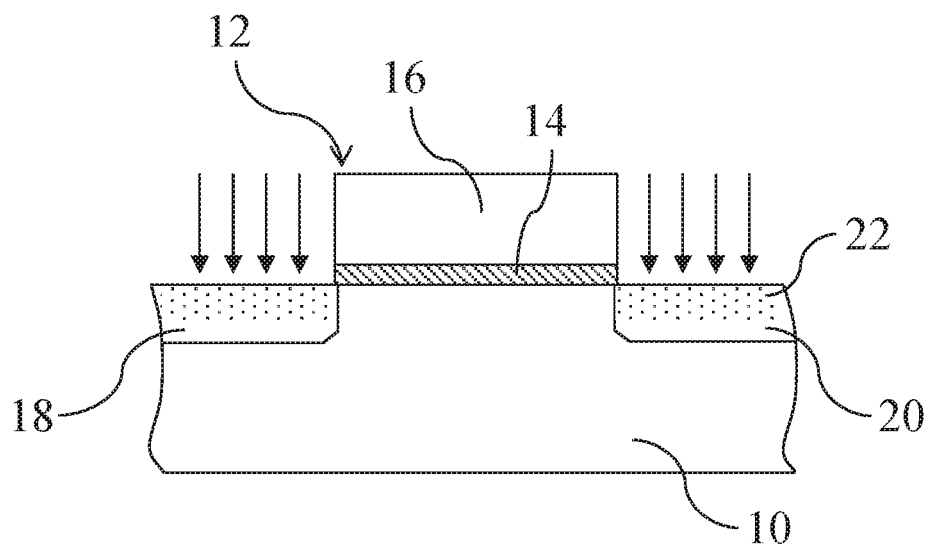
FIG. 1(a) is a diagram schematically showing that additional ions are implanted into first ion-doped regions (the source and the drain) according to one embodiment of the present invention.
Figure 1B:
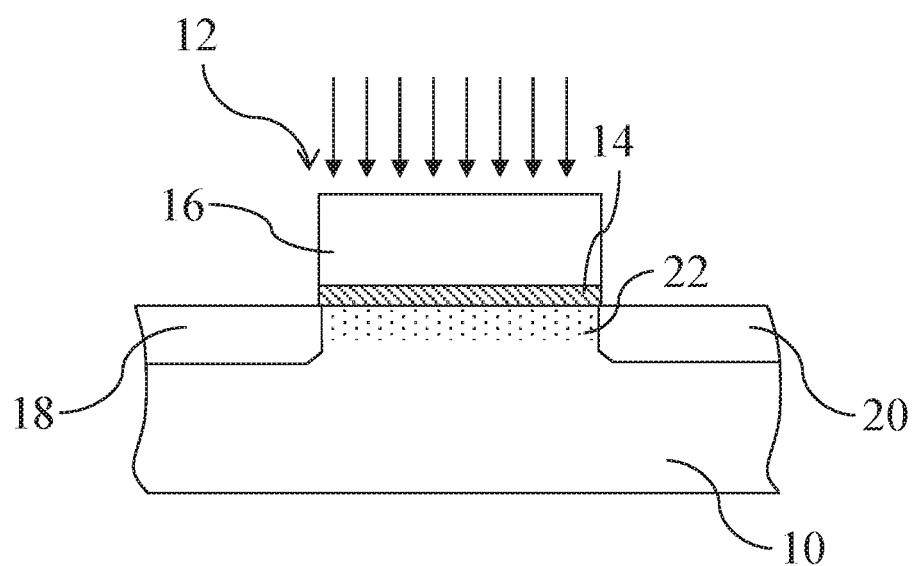
FIG. 1(b) is a diagram schematically showing that additional ions are implanted into a semiconductor substrate according to one embodiment of the present invention.

Refer to FIG. 1(a) and FIG. 1(b). The EEPROM of the present invention comprises a semiconductor substrate 10 and at least one transistor structure 12 formed in the semiconductor substrate 10. The transistor structure 12 includes a first dielectric layer 14 formed on the surface of the semiconductor substrate 10; a first electric-conduction gate 16 formed on the first dielectric layer 14; and at least two first ion-doped regions (18 and 20) formed inside the semiconductor substrate 10 and respectively at two sides of the first electric-conduction gate 16 to separately function as a source 18 and a drain 20. The present invention uses the voltage difference between the gate and the source/drain or the voltage difference between the gate and the substrate/well to make electrons pass through the dielectric layer (oxide layer) so as to write or erase EEPROM in a lower current. The present invention uses two methods to increase the concentration of the implanted ions. The first method is shown in FIG. 1(a). In the first method, the same type of ions 22 are further implanted into the regions of the first ion-doped regions 18 and 20, which are respectively at the interface of the source 18 and the first electric-conduction gate 16 and the interface of the drain 20 and the first electric-conduction gate 16. It is meant by the same type of ions 22: if the first ion-doped regions 18 and 20 are P-type, the implanted ions 22 are also P-type; if the first ion-doped regions 18 and 20 are N-type, the implanted ions 22 are also N-type. The ion concentration of the first ion-doped regions 18 and 20 is increased 1-10 times higher than the original ion concentration. Thus, a lower voltage difference can be applied to the transistor structure and the first electric-conduction gate 16 for writing or erasing. The second method is shown in FIG. 1(b). In the second method, the same type of ions 22 are implanted into a region of the semiconductor substrate 10, which is between the interface of the source 18 and the first electric-conduction gate 16 and the interface of the drain 20 and the first electric-conduction gate 16. It is meant by the same type of ions 22: if the semiconductor substrate 10 is P-type, the implanted ions 22 are also P-type; if the semiconductor substrate 10 is N-type, the implanted ions 22 are also N-type. The ion concentration of the semiconductor substrate 10 is increased 1-10 times higher than the original ion concentration. Thus, a lower voltage difference can be applied to the semiconductor substrate 10 and the first electric-conduction gate 16 for writing or erasing.

Spacers (not shown in the drawings) are respectively formed on two side walls of the first dielectric layer 14 and the first electric-conduction gate 16. The implantation of the same type of ions into the first ion-doped regions is undertaken before the formation of the spacers. In one embodiment, each of the first ion-doped regions 18 and 20 further has a light doped drain (LDD). In such a case, LDD is the preferred doped region.

In addition to the abovementioned single-gate structure, the abovementioned two ion concentration-increasing methods are also applied to a single-floating gate structure. The memory cell of the EEPROM with a single-floating gate structure further comprises a capacitor structure. The second electric-conduction gate of the capacitor is electrically connected with the first electric-conduction gate and functions as a single floating gate. The detail of different structures and the operating methods thereof will be described below.

Figure 2:
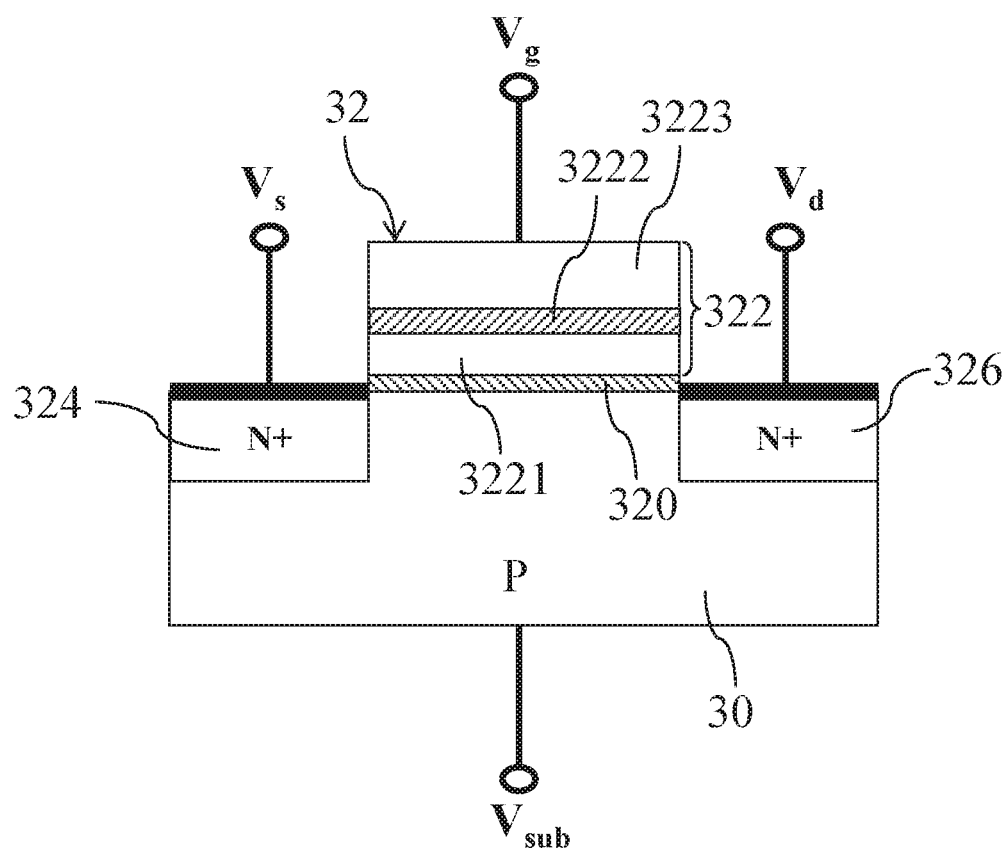
FIG. 2 is a diagram schematically showing a single memory cell with an N-type transistor and a single-gate structure according to one embodiment of the present invention.

Refer to FIG. 2 a diagram schematically showing a single memory cell with an N-type transistor and a single-gate structure according to one embodiment of the present invention. In the embodiment shown in FIG. 2, a memory cell of the EEPROM of the present invention comprises a P-type semiconductor substrate 30 or a semiconductor substrate with a P-type well. In FIG. 2, the memory cell with a P-type semiconductor substrate 30 is used as an exemplification. An N-type transistor 32, such as an N-type MOSFET (Metal-Oxide-Semiconductor Field-Effect Transistor), is formed in the P-type semiconductor substrate 30. The N-type transistor 32 includes a first dielectric layer 320 formed on the surface of the P-type semiconductor substrate 30; a first electric-conduction gate 322 stacked on the first dielectric layer 320; and two N-type ion-doped regions formed inside the P-type semiconductor substrate 30 and respectively functioning as a source 324 and a drain 326, wherein a channel exists between the source 324 and the drain 326, and wherein first electric-conduction gate 322 further includes a floating gate 3221, a control dielectric layer 3222, a control gate 3223 stacked over the first dielectric layer 320 bottom up in sequence. The structure described above is a single-gate structure.

Figure 3:
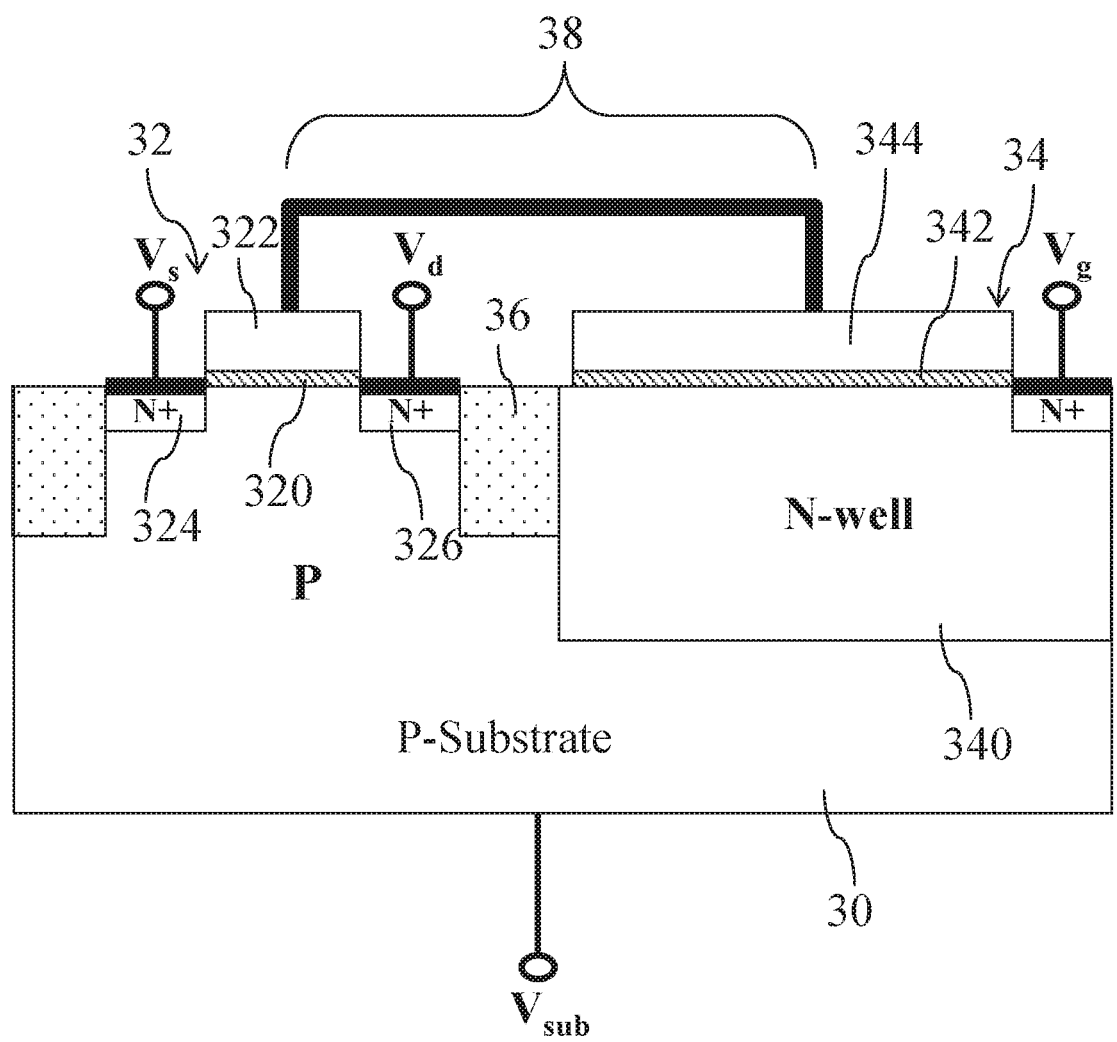
FIG. 3 is a diagram schematically showing a single memory cell with an N-type transistor and a single-floating gate structure according to one embodiment of the present invention.

Refer to FIG. 3 a diagram schematically showing a single memory cell with an N-type transistor and a single-floating gate structure according to one embodiment of the present invention. In the embodiment shown in FIG. 3, a memory cell of the EEPROM of the present invention comprises a P-type semiconductor substrate 30, an N-type transistor 32, such as an N-type MOSFET, formed in the P-type semiconductor substrate 30, and an N-well capacitor 34 formed in the P-type semiconductor substrate 30 and separated from the N-type transistor 32 by a spacer 36. The N-type transistor 32 includes a first dielectric layer 320 firmed on the surface of the P-type semiconductor substrate 30; a first electric-conduction gate 322 stacked on the first dielectric layer 320; and two N-type ion-doped regions formed inside the P-type semiconductor substrate 30 and respectively functioning as a source 324 and a drain 326, wherein a channel exists between the source 324 and the drain 326. The N-well capacitor 34 includes a second ion-doped region formed in the P-type semiconductor substrate 30 and functioning as an N-type well 340; a second dielectric layer 342 formed on the surface of the N-type well 340; and a second electric-conduction gate 344 formed on the second dielectric layer 342, whereby a top plate-dielectric layer-bottom plate capacitor structure is formed. The first electric-conduction gate 322 of the N-type transistor 32 and the second electric-conduction gate 344 of the N-well capacitor 34 are electrically connected with each other and separated by the spacer 36 to form the structure of a single floating gate 38.

Refer to FIG. 2 and FIG. 3. Suppose that the memory cell of the EEPROM has the N-type transistor 32 and that the same type (N-type) ions are implanted into the regions of the ion-doped regions, which are respectively near the interface of the first electric-conduction gate 322 and the source 324 and the interface of the first electric-conduction gate 322 and the drain 326, to increase the ion concentration by 1-10 tunes. No matter whether the memory cell structure shown in FIG. 2 or FIG. 3 is used, the operating method of the present invention comprises a step: respectively applying a gate voltage $V_g$, a source voltage $V_s$, a drain voltage $V_d$ and a substrate voltage $V_{sub}$ to the first electric-conduction gate 322 (or the single floating gate 38), the source 324, the drain 326 and the P-type semiconductor substrate 30, wherein in writing the N-type transistor 32, $V_{sub}$=ground, $V_s$=$V_d$≥0, and $V_g$=HV (High Voltage), or $V_{sub}$=ground, $V_s$=$V_d$=HV, and $V_g$>2V, and wherein in erasing the N-type transistor 32, $V_{sub}$=ground, $V_s$=$V_d$=HV, and $V_g$=0, floating voltage, or <2V. In writing a P-type transistor, $V_{sub}$=HV, $V_s$=$V_d$≤HV, and $V_g$=0, or $V_{sub}$=HV, $V_s$=$V_d$=0, and $V_g$ is smaller than HV=2V. In erasing the P-type transistor, $V_{sub}$=HV, $V_s$=$V_d$=0, and $V_g$ is floating voltage or smaller than HV=2V.

Refer to FIG. 2 and FIG. 3 again. Suppose that the memory cell of the EEPROM has the N-type transistor 32 and that the same type (P-type) ions are implanted into the region of the P-type semiconductor substrate 20, which is near the interface of the source 324 and the first electric-conduction gate 322 and the interface of the drain 326 and the first electric-conduction gate 322, to increase the ion concentration by 1-10 times. The operating method of the present invention comprises a step: respectively applying a gate voltage $V_g$, a source voltage $V_s$, a drain voltage $V_d$ and a substrate voltage $V_{sub}$ to the first electric-conduction gate 322 (or the single floating gate 38), the source 324, the drain 326 and the semiconductor substrate 30, wherein in writing the N-type transistor, $V_{sub}$=ground, $V_s$=$V_d$≥0, and $V_g$=HV (High Voltage), or $V_{sub}$=ground, $V_s$=$V_d$=HV, and $V_g$>2V, and wherein in erasing the N-type transistor, $V_{sub}$=ground, $V_s$=$V_d$=HV, and $V_g$=0, floating voltage, or <2V. In writing a P-type transistor, $V_{sub}$=HV, $V_s$=$V_d$≤HV, and $V_g$=0, or $V_{sub}$=HV, $V_s$=$V_d$=0, and $V_g$ is smaller than HV=2V. In erasing the P-type transistor, $V_{sub}$=HV, $V_s$=$V_d$=0, and $V_g$ is floating voltage or smaller than HV=2V.

Figure 4:
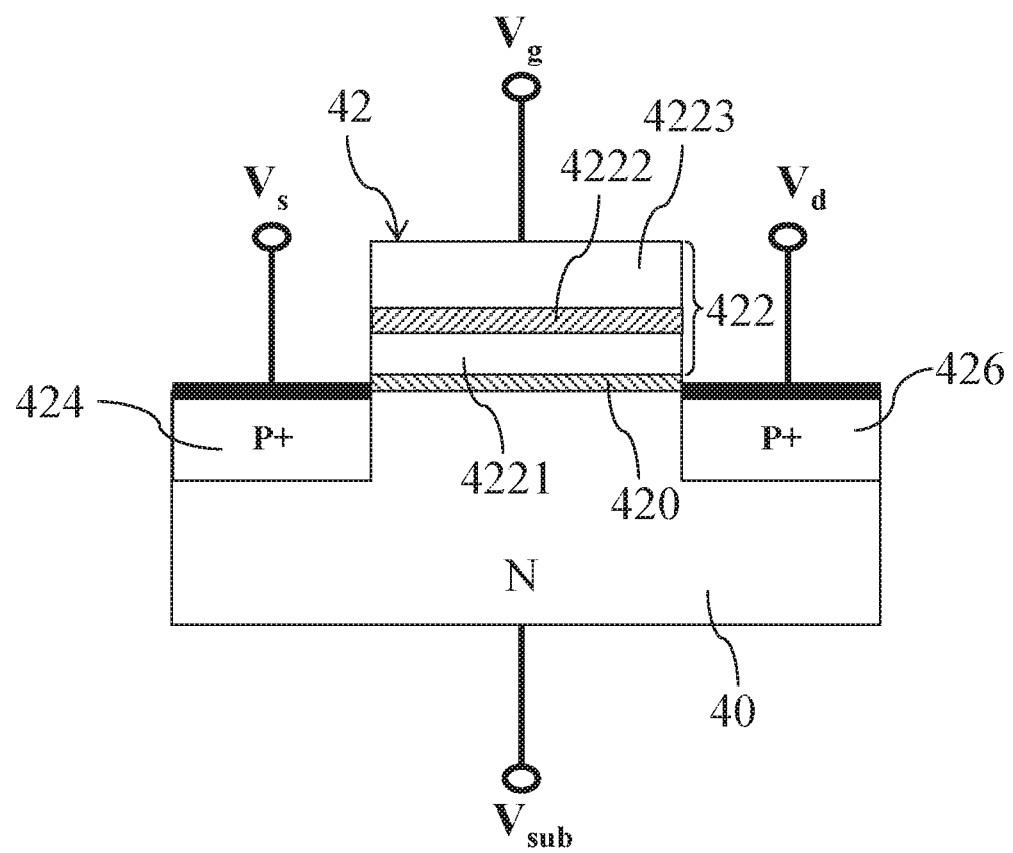
FIG. 4 is a diagram schematically showing a single memory cell with a P-type transistor and a single-gate structure according to one embodiment of the present invention.

Refer to FIG. 4 a diagram schematically showing a single memory cell with a P-type transistor and a single-gate structure according to one embodiment of the present invention. In the embodiment shown in FIG. 4, a memory cell of the EEPROM of the present invention comprises an N-type semiconductor substrate 40 or a semiconductor substrate with an N-type well. In FIG. 4, the memory cell with an N-type semiconductor substrate 40 is used as an exemplification. A P-type transistor 42, such as a P-type MOSFET, is formed in the N-type semiconductor substrate 40. The P-type transistor 42 includes a first dielectric layer 420 formed on the surface of the N-type semiconductor substrate 40; a first electric-conduction gate 422 stacked on the first dielectric layer 420; and two P-type ion-doped regions formed inside the N-type semiconductor substrate 40 and respectively functioning as a source 424 and a drain 426, wherein a channel exists between the source 424 and the drain 426, and wherein first electric-conduction gate 422 further includes a floating gate 4221, a control dielectric layer 4222, a control gate 4223 stacked over the first dielectric layer 420 bottom up in sequence. The structure described above is a single-gate structure.

Figure 5:
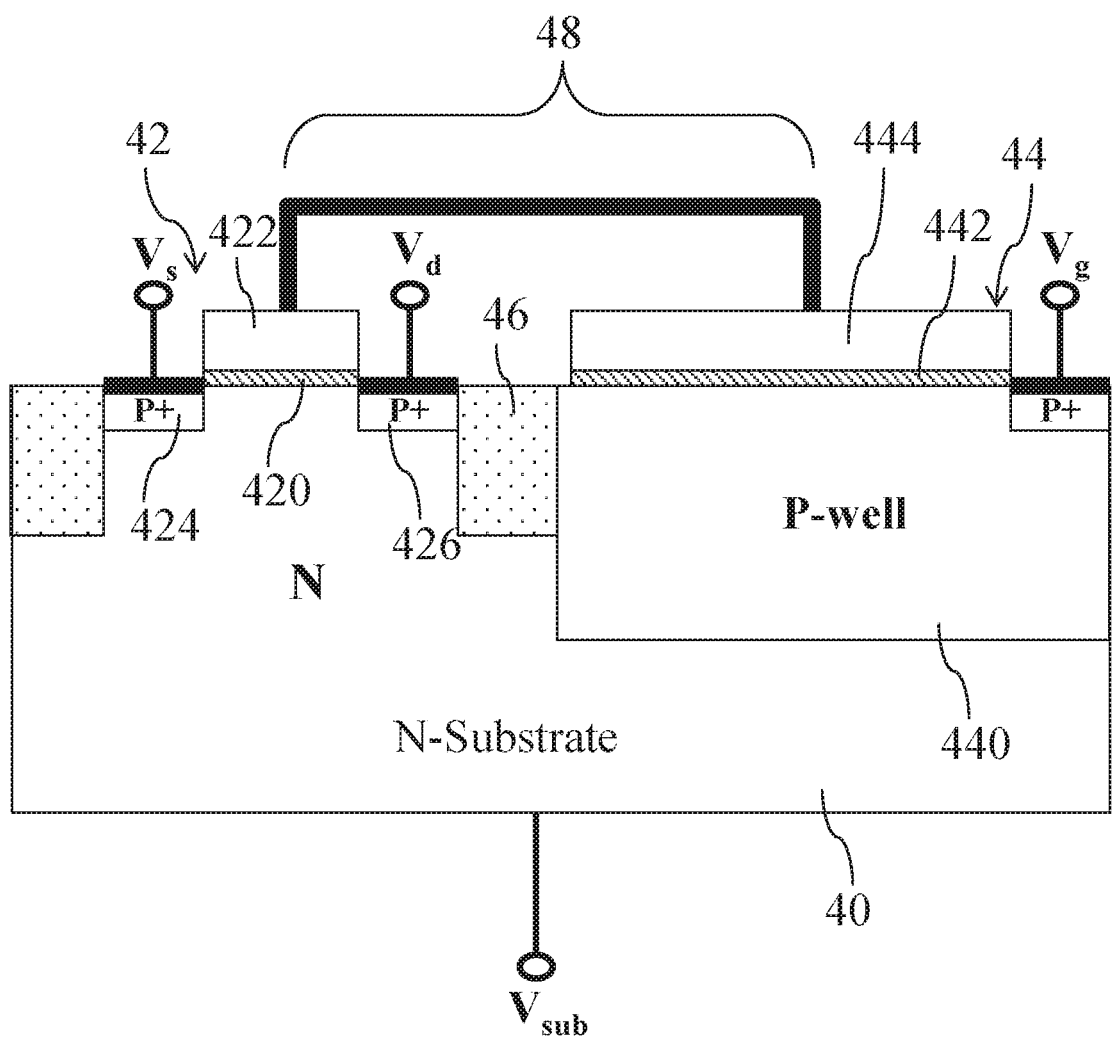
FIG. 5 is a diagram schematically showing a single memory cell with a P-type transistor and a single-floating gate structure according to one embodiment of the present invention.

Refer to FIG. 5 a diagram schematically showing a single memory cell with a P-type transistor and a single-floating gate structure according to one embodiment of the present invention. In the embodiment shown in FIG. 5, a memory cell of the EEPROM of the present invention comprises an N-type semiconductor substrate 40. A P-type transistor 42 and a P-well capacitor 44 are formed in the N-type semiconductor substrate 40 and separated by a spacer 46. The P-type transistor 42, such as a P-type MOSFET, includes a first dielectric layer 420 formed on the surface of the N-type semiconductor substrate 40; a first electric-conduction gate 422 stacked on the first dielectric layer 420; and two P-type ion-doped regions formed inside the N-type semiconductor substrate 40 and respectively functioning as a source 424 and a drain 426, wherein a channel exists between the source 424 and the drain 426. The P-well capacitor 44 includes a second ion-doped region formed inside the N-type semiconductor substrate 40 and functioning as a P-type well 440, a second dielectric layer 442 formed on the surface of the P-type well 440, and a second electric-conduction gate 444 formed on the second dielectric layer 442, whereby to form a top plate-dielectric layer-bottom plate capacitor structure. The first electric-conduction gate 422 of the P-type transistor 42 and the second electric-conduction gate 444 of the P-well capacitor 44 are electrically connected with each other and separated by the spacer 46 to form a single floating gate 48.

Refer to FIG. 4 and FIG. 5. No matter whether the memory cell is that shown in FIG. 4 or FIG. 5, it has a P-type transistor 42, and the same type (P-type) ions are implanted into the ion-doped regions near the interface of the source 424 and the first electric-conduction gate 422 and the interface of the drain 426 and the first electric-conduction gate 422 to increase the ion concentration by 1-10 times. In such cases, the operating method of the present invention comprises a step: respectively applying a gate voltage $V_g$, a source voltage $V_s$, a drain voltage $V_d$ and a substrate voltage $V_{sub}$ to the first electric-conduction gate 422 (or the single floating gate 48), the source 424, the drain 426 and the semiconductor substrate 40, wherein in writing an N-type transistor, $V_{sub}$=ground, $V_s$=$V_d$≥0, and $V_g$=HV (High Voltage), or $V_{sub}$=ground, $V_s$=$V_d$=HV, and $V_g$>2V, and wherein in erasing the N-type transistor, $V_{sub}$=ground, $V_s$=$V_d$=HV, and $V_g$=0, floating voltage, or <2V. In writing the P-type transistor, $V_{sub}$=HV, $V_s$,$V_d$≤HV, and $V_g$=0, or $V_{sub}$=HV, $V_s$=$V_d$=0, and $V_g$ is smaller than HV=2V. In erasing the P-type transistor, $V_{sub}$=HV, $V_s$=$V_d$=0, and $V_g$ is floating voltage or smaller than HV=2V.

Refer to FIG. 4 and FIG. 5 again. No matter whether the memory cell is that shown in FIG. 4 or FIG. 5, it has a P-type transistor 42, and the same type (N-type) ions are implanted into the region of the N-type semiconductor substrate 40, which is near the interface of the source 424 and the first electric-conduction gate 422 and the interface of the drain 426 and the first electric-conduction gate 422 to increase the ion concentration by 1-10 times. In such cases, the operating method of the present invention comprises a step: respectively applying a gate voltage $V_g$, a source voltage $V_s$, a drain voltage $V_d$ and a substrate voltage $V_{sub}$ to the first electric-conduction gate 422 (or the single floating gate 48), the source 424, the drain 426 and the semiconductor substrate 40, wherein in writing, $V_{sub}$=HV, $V_s$=$V_d$≤HV, and $V_g$=0, or $V_{sub}$=HV, $V_s$=$V_d$=0, and $V_g$ is smaller than HV=2V. In erasing, $V_{sub}$=HV, $V_s$=$V_d$=0, and $V_g$ is floating voltage or smaller than HV=2V.

The writing and erasing activities correlates with the doping concentration, which influences the voltages needs applying to the source, the drain and the gate. As long as sufficient voltage differences are applied to the source, the drain and the gate, writing or erasing will be enabled. Therefore, the high voltage required in the conventional technology can be reduced via replacing the grounding with a negative voltage.

The embodiments have been described above to demonstrate the technical thoughts and characteristics of the present invention and enable the persons skilled in the art to understand, make, and use the present invention. However, these embodiments are only to exemplify the present invention but not to limit the scope of the present invention. Any equivalent modification or variation according to the spirit of the present invention is to be also included within the scope of the present invention.

What is claimed is:

1. An operating method for a low voltage difference-operated EEPROM, wherein said low voltage difference-operated electrically erasable programmable read only memory comprises a semiconductor substrate and at least one transistor structure formed in said semiconductor substrate, and wherein said transistor structure includes a first electric-conduction gate and at least two first ion-doped regions formed inside said semiconductor substrate and located at two sides of said first electric-conduction gate to function as a source and a drain, and wherein regions of said first ion-doped regions, which are near an interface of said source and said first electric-conduction gate and an interface of said drain and said first electric-conduction gate, are further implanted with the same type of ions to increase an ion concentration of said regions of said first ion-doped regions, and wherein said method comprises a step:

respectively applying a gate voltage $V_g$, a source voltage $V_s$, a drain voltage $V_d$ and a substrate voltage $V_{sub}$ to said first electric-conduction gate, said source, said drain and said semiconductor substrate, wherein if said transistor structure is an N-type transistor structure, in writing, $V_{sub}$=ground, $V_s$=$V_d$≥0, and $V_g$=HV (High Voltage), or $V_{sub}$=ground, $V_s$=$V_d$=HV, and $V_g$>2V, in erasing, $V_{sub}$=ground, $V_s$=$V_d$=HV, and $V_g$=0, a floating voltage, or <2V, and wherein if said transistor structure is a P-type transistor structure, in writing, $V_{sub}$=HV (High Voltage), $V_s$=$V_d$≤HV, and $V_g$=0, or $V_{sub}$=HV, $V_s$=$V_d$=0, and $V_g$ is smaller than HV=2V, in erasing, $V_{sub}$=HV, $V_s$=$V_d$=0, and $V_g$ is a floating voltage or smaller than HV=2V.

2. The operating method for a low voltage difference-operated electrically erasable programmable read only memory according to claim 1, wherein said electrically erasable programmable read only memory further comprises a capacitor structure formed in said semiconductor substrate and separated from said at least one transistor structure, and wherein said capacitor structure includes a second ion-doped region formed inside said semiconductor substrate and a second electric-conduction gate, and wherein said second electric-conduction gate is electrically connected with said first electric-conduction gate to function as a single floating gate, and wherein said gate voltage $V_g$ is applied to said single floating gate.

3. The operating method for a low voltage difference-operated EEPROM according to claim 1, wherein if said transistor structure is an N-type transistor, said first ion-doped regions are N-type ion-doped regions, and said semiconductor substrate is a P-type semiconductor substrate or a semiconductor substrate with a P-type well, and wherein if said transistor structure is a P-type transistor, said first ion-doped regions are P-type ion-doped regions, and said semiconductor substrate is an N-type semiconductor substrate or a semiconductor substrate with an N-type well.

4. The operating method for a low voltage difference-operated EEPROM according to claim 2, wherein if said transistor structure is an N-type transistor, said first ion-doped regions and said second ion-doped region are N-type ion-doped regions, and said semiconductor substrate is a P-type semiconductor substrate or a semiconductor substrate with a P-type well, and wherein if said transistor structure is a P-type transistor, said first ion-doped regions and said second ion-doped region are P-type ion-doped regions, and said semiconductor substrate is an N-type semiconductor substrate or a semiconductor substrate with an N-type well.

* * * * *